US007622752B2

(12) United States Patent
Lanois et al.

(10) Patent No.: US 7,622,752 B2
(45) Date of Patent: Nov. 24, 2009

(54) SCHOTTKY DIODE WITH A VERTICAL BARRIER

(75) Inventors: Frédéric Lanois, Tours (FR); Sylvain Nizou, Vernou sur Brenne (FR)

(73) Assignees: STMicroelectronics S.A., Montrouge (FR); STMicroelectronics Maroc, Casablanca (MA)

( * ) Notice: Subject to any disclaimer, the term of this patent is extended or adjusted under 35 U.S.C. 154(b) by 0 days.

(21) Appl. No.: 11/317,270

(22) Filed: Dec. 23, 2005

(65) Prior Publication Data

US 2006/0138450 A1      Jun. 29, 2006

(30) Foreign Application Priority Data

Dec. 23, 2004    (FR)    .................... 04 53183

(51) Int. Cl.
*H01L 31/111* (2006.01)
(52) U.S. Cl. ............... 257/109; 257/453; 257/E21.064; 438/92
(58) Field of Classification Search ............ 257/109, 257/471, 472, 473, 487, 496, 57, 73, 155, 257/449, 453, 454, E51.009, E33.051, E31.066, 257/E27.004, E21.064, 54, 478; 438/92, 438/534
See application file for complete search history.

(56) References Cited

U.S. PATENT DOCUMENTS

| 3,977,910 | A | * | 8/1976 | Anthony et al. | ............. 438/540 |
| 4,377,423 | A | * | 3/1983 | Anthony | ....................... 117/40 |
| 4,482,907 | A |  | 11/1984 | Jay et al. | |
| 4,721,986 | A | * | 1/1988 | Kinzer | ....................... 257/336 |
| 4,724,223 | A |  | 2/1988 | Ditchek | |
| 4,984,037 | A | * | 1/1991 | Ditchek et al. | ............. 257/267 |
| 5,040,034 | A | * | 8/1991 | Murakami et al. | .......... 257/330 |
| 5,285,090 | A |  | 2/1994 | Ditchek et al. | |
| 5,471,072 | A | * | 11/1995 | Papanicolaou | ............... 257/77 |
| 6,078,090 | A | * | 6/2000 | Williams et al. | ............. 257/476 |
| 6,586,801 | B2 | * | 7/2003 | Onishi et al. | ................. 257/339 |
| 6,593,620 | B1 | * | 7/2003 | Hshieh et al. | ................ 257/335 |
| 6,821,824 | B2 | * | 11/2004 | Minato et al. | ................ 438/138 |
| 7,002,205 | B2 | * | 2/2006 | Onishi et al. | ................. 257/328 |
| 7,166,867 | B2 | * | 1/2007 | Beach et al. | ................... 257/79 |
| 2005/0121691 | A1 |  | 6/2005 | Morand | |
| 2005/0121732 | A1 |  | 6/2005 | Morand | |
| 2005/0127434 | A1 |  | 6/2005 | Quoirin et al. | |

FOREIGN PATENT DOCUMENTS

| EP | 0 271 346 | 6/1988 |
| WO | WO 03/096433 A1 | 11/2003 |

OTHER PUBLICATIONS

French Search Report from French Patent Application No. 04/53183, filed Dec. 23, 2004.
Kumar M.J. et al. "A New, High-Voltage 4H-SIC Lateral Dual Sidewall Schottky (LDSS) Rectifier: Theoretical Invetigation and Analysis" IEEE# Transactions on Electron Devices, IEEE Inc. New York, US, vol. 50, No. 7, Jul. 2003 pp. 1690-1693, XP001168267 ISSN: 0018-9383.

\* cited by examiner

*Primary Examiner*—Thinh T Nguyen
(74) *Attorney, Agent, or Firm*—Lisa K. Jorgenson; James H. Morris; Wolf, Greenfield & Sacks, P.C.

(57) ABSTRACT

A Schottky diode with a vertical barrier extending perpendicularly to the surface of a semiconductor chip having a vertical central metal conductor in contact on the one hand with the substrate of the semiconductor chip with an interposed interface forming a Schottky barrier, and on the other hand with radially-extending conductive fingers.

7 Claims, 11 Drawing Sheets

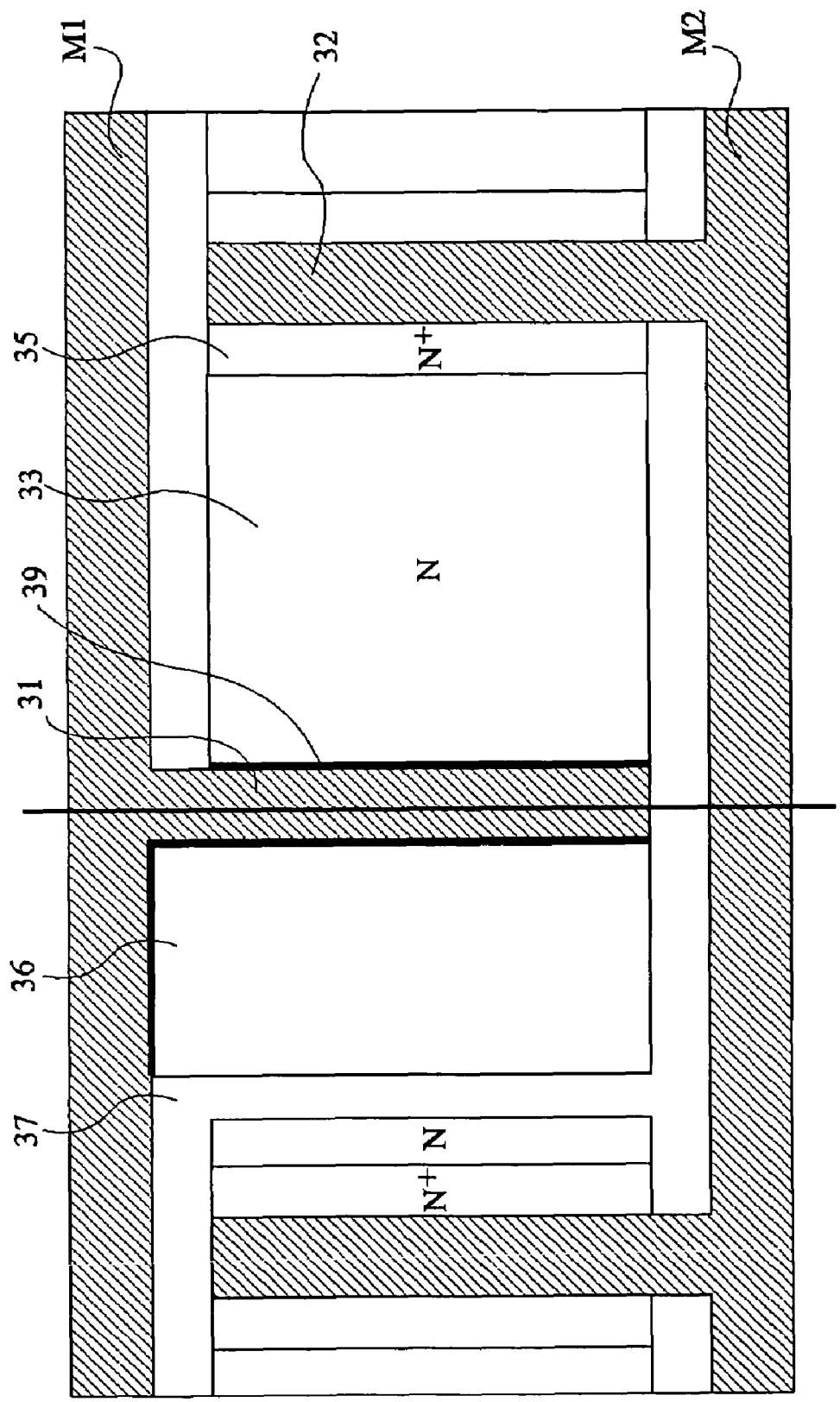

SCHOTTKY DIODE WITH A VERTICAL BARRIER

BACKGROUND OF THE INVENTION

1. Field of the Invention

The present invention relates to the manufacturing of Schottky diodes, and especially of average-power Schottky diodes, capable of conducting a forward current with a low voltage drop, and to stand high reverse voltages with a small leakage current.

2. Discussion of the Related Art

Conventionally, such Schottky diodes are formed so that their junction/barrier is parallel to the main plane of the wafer in which they are formed, as illustrated in FIG. 1. It is spoken of a horizontal junction. The diode is formed from a heavily-doped silicon substrate 1 of a first conductivity type, here, type N, on which is formed a more lightly doped epitaxial layer 2. On the upper surface side is formed a Schottky diode between a metal, or more often a metal silicide 3, and epitaxial layer 2. To improve the breakdown voltage, the periphery of the Schottky junction is for example surrounded with a P-type ring 4. An insulating layer 5 is intended to ensure the necessary insulations. A metallization M1 is formed on the upper surface side, and a metallization M2 is formed on the lower surface side.

In such a Schottky diode, in the conductive state, the current flows from the upper surface to the lower surface of a silicon chip. It should however be noted that the barrier or Schottky junction is horizontal (parallel to the plane of the main diode surfaces).

Several improvements have been brought to the Schottky diodes, especially to reduce their forward voltage drop, by providing means for ensuring a depletion of the area corresponding to the substrate in the vicinity of the Schottky junction when the reverse voltage increases. Examples of such structures are illustrated in FIGS. 2, 3A, and 3B.

In FIG. 2, conductive fingers 10 surrounded with an insulator 11 penetrate into the substrate at regular intervals from the Schottky contact area, these fingers being in contact with the upper metallization. Such a Schottky diode structure, or MOS barrier Schottky diode, is currently designated as a TMBS (Trench MOS Barrier Schottky).

In FIG. 3A, P-type silicon fingers 20 in contact with the upper metallization penetrate into the substrate. Such a diode or Schottky-bipolar diode is currently called a JBS diode (for Junction Barrier Schottky).

FIG. 3B shows a variation with floating islets of the Schottky-bipolar diode of FIG. 3A, in which fingers 20 are divided into separate fingers 20a-20b coupled together by capacitive effect.

In all these known structures, the junction or Schottky barrier, possibly formed of several elements, is always horizontal for each of the considered elements.

Further, the applicant has described in unpublished French application 03/50985 of Dec. 5, 2003, inventor Jean-Luc Morand, semiconductor components with a vertical active junction.

The appended FIGS. 4 and 5 are FIGS. 3 and 4 of this patent application.

FIGS. 4 and 5 are cross-section and perspective views showing an example of cells of vertical junction diodes, with no metallization. A diode cell is formed of an interface between N and P regions 21 and 23, region 23 being in contact with a metallization 22, and region 21 being in contact with a metallization 24. All the metallizations of the same type as metallization 22 are connected to a same anode metallization, and all the metallizations of the same type as metallization 24 are connected to a same cathode metallization. Preferably, the anode and cathode metallizations are arranged on opposite surfaces of the component. An advantage of this structure for a power diode is that the junctions extend across the entire diode thickness and that that the junction surface area may be greater than in the case of horizontal junction diodes, in which the junction surface area is limited to the silicon chip surface area. In the embodiment of FIG. 4, the various diodes are arranged in parallel strips. In the embodiment of FIG. 5, the various diodes have circular structures. Other topologies may be adopted provided that the diodes have vertical junctions.

The structures of FIGS. 4 and 5 may easily be adapted to the forming of a Schottky diode with a vertical junction (or barrier) by replacing P-type region 23 with a metal, a metal silicide, or another material forming a Schottky barrier with an N region.

SUMMARY OF THE INVENTION

An object of the present invention is to provide novel structures of TMBS or JBS diodes with a vertical junction (barrier).

To achieve this and other objects, the present invention provides a Schottky diode with a vertical barrier extending perpendicularly to the surface of a semiconductor chip comprising a vertical central metal conductor in contact on the one hand with the substrate of the semiconductor chip with an interposed interface forming a Schottky barrier, and on the other hand with radially-extending conductive fingers.

According to an embodiment of the present invention, the diode is of TMBS type, and the radially-extending conductive fingers are insulated at their periphery.

According to an embodiment of the present invention, the diode is of Schottky-bipolar type, and the radially-extending fingers correspond to heavily-doped P-type semiconductor regions.

According to an embodiment of the present invention, said fingers are separated in discontinuous fragments.

According to an embodiment of the present invention, the shape in top view of said fingers is optimized by the selection of an adapted mask.

According to an embodiment of the present invention, the end of said fingers is rounded.

According to an embodiment of the present invention, the end of said fingers is wider and narrower than the portion of said fingers in contact with the central conductor.

In the application to a TMBS or JBS diode, an additional advantage is obtained with respect to the advantage of the increase in the junction surface area with respect to the surface area of a chip. Indeed, it will be shown that, according to an advantage of the present invention, specific topologies enabling improving the features of forward voltage drop reduction, of reverse breakdown voltage increase, and of reverse leakage current reduction, may be formed.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 6B is a cross-section view along line A-A of FIG. 6A;

DETAILED DESCRIPTION

Figure 1:
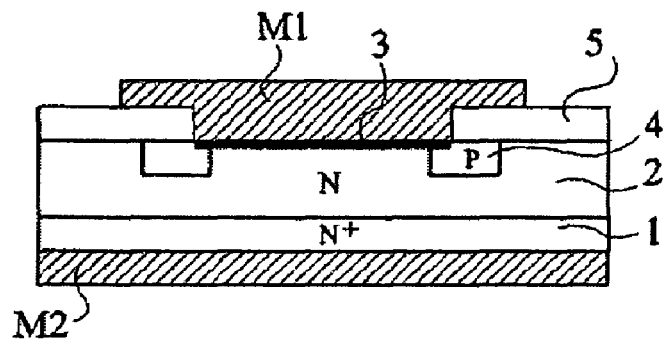
FIGS. 1, 2, 3A, and 3B, previously described, are cross-section views illustrating various types of conventional Schottky diodes.

For clarity, the same elements have been designated with the same reference numerals in the different drawings and, further, as usual in the representation of integrated components, the various drawings are not to scale.

Figure 4:
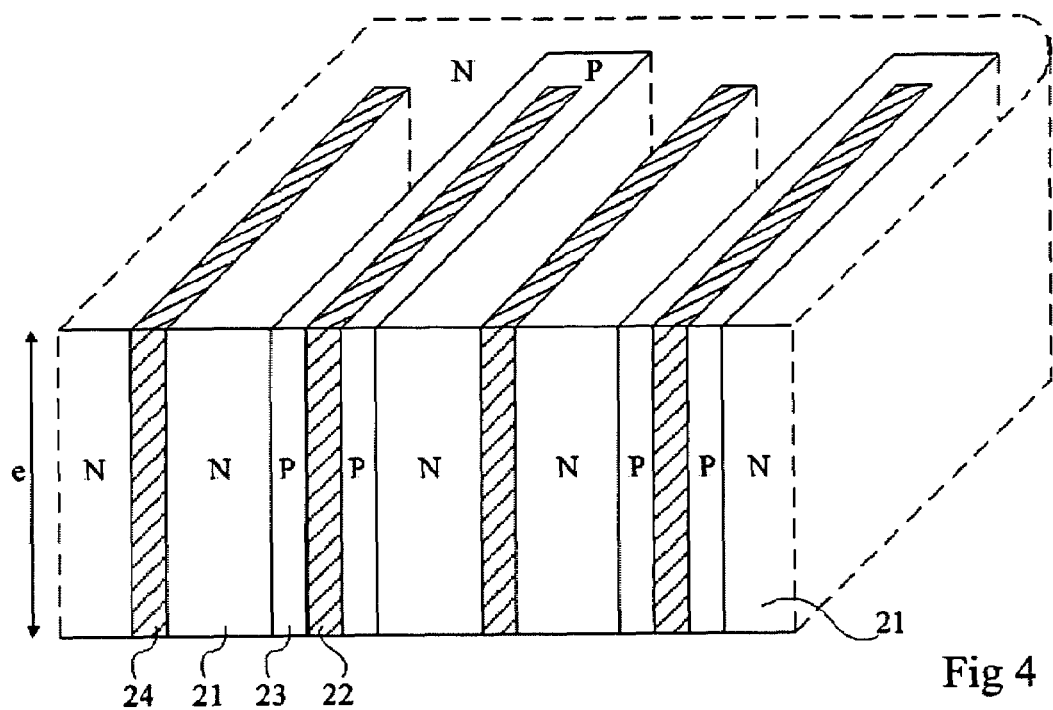
FIGS. 4 and 5 show bipolar diodes with a vertical junction such as described in unpublished French application 03/50985.
Figure 5:
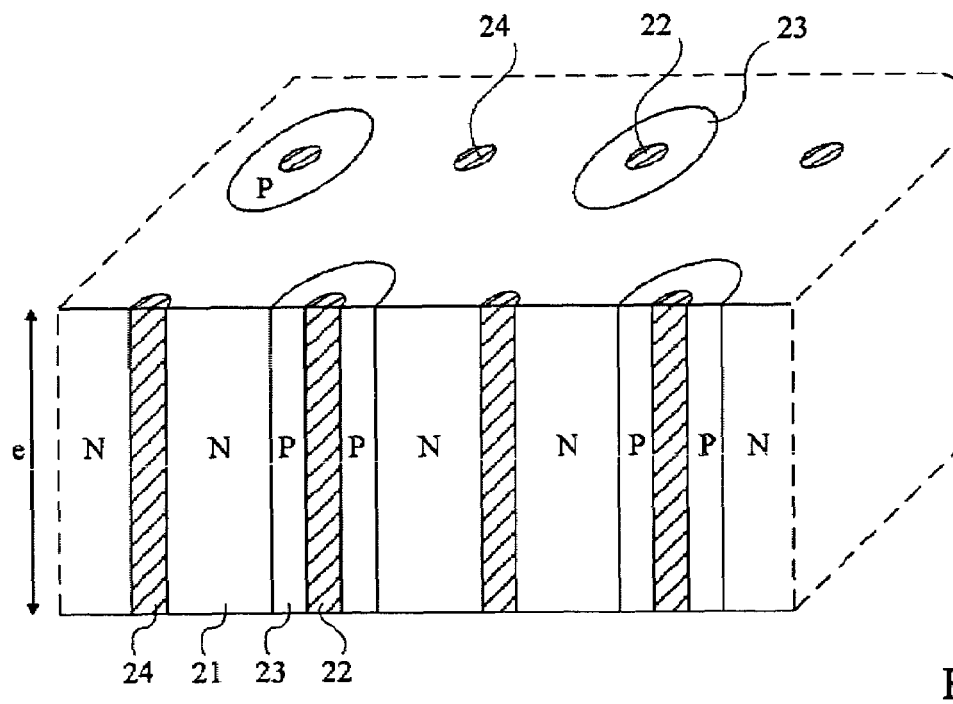
Figure 6A:
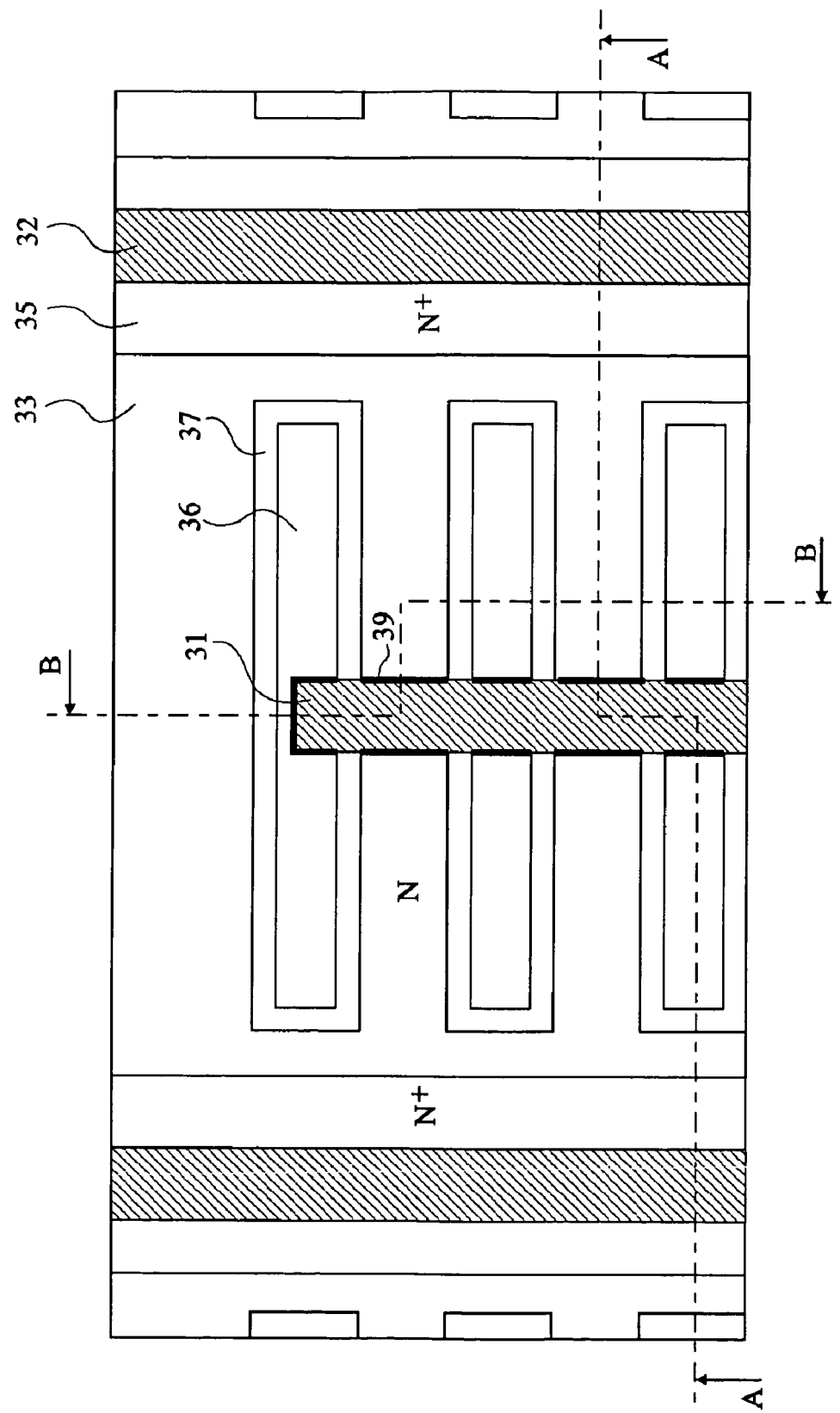
FIG. 6A is a top view of a TMBS-type Schottky diode according to an embodiment of the present invention.
Figure 6C:
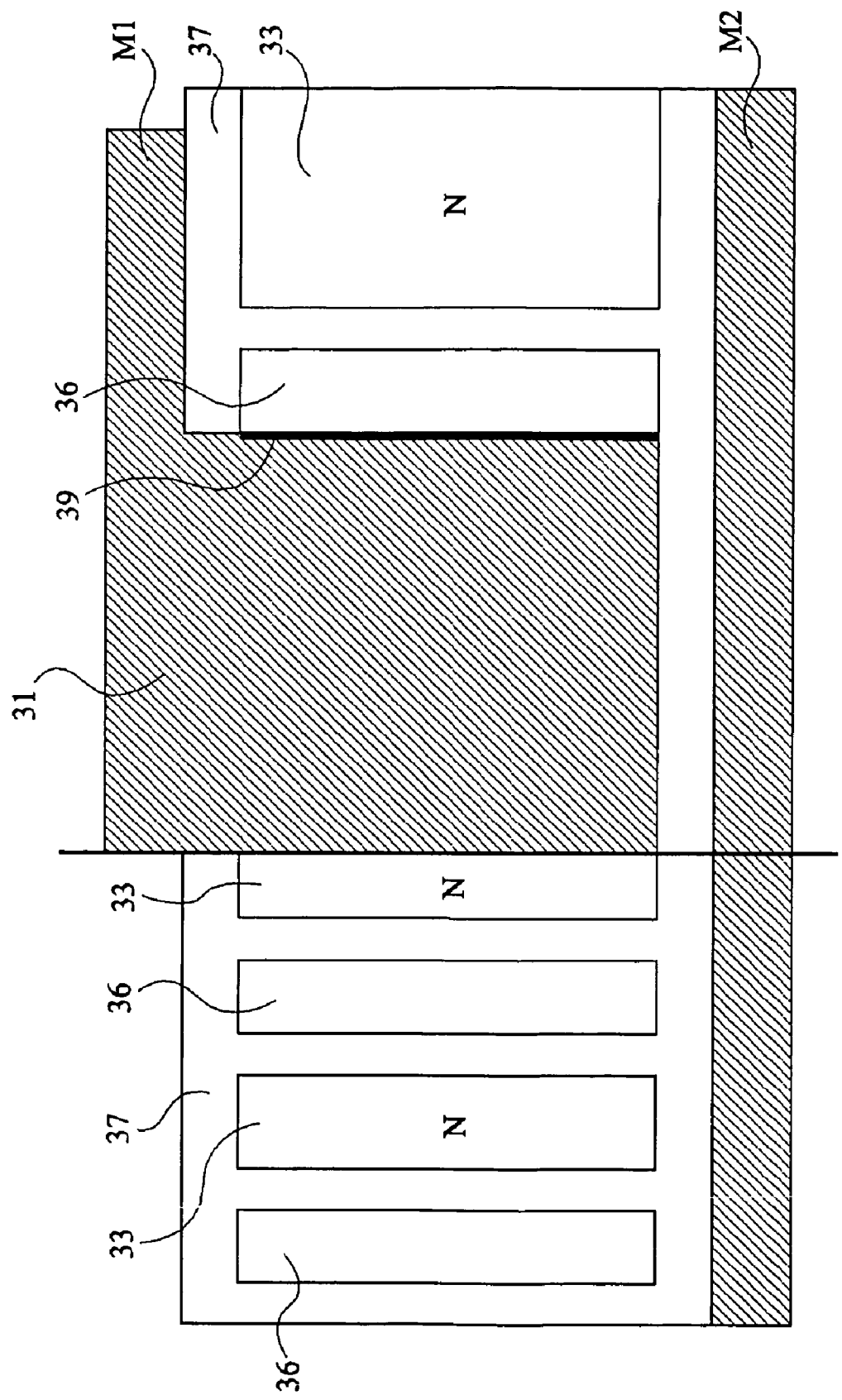
FIG. 6C is a cross-section view along line B-B of FIG. 6A.

Referring to FIGS. 6A, 6B, and 6C which are respectively a top view, a cross-section view along line A-A, and a cross-section view along line B-B, an embodiment of a TMBS Schottky diode according to the present invention will be described. These drawings show two diode cells on either side of an anode. It should be understood that this pattern may be repeated by symmetry. It should also be understood that the illustrated topology is an example only of a possible topology. Especially, referring to FIGS. 4 and 5, it should be noted that it can be passed from "strip"-type topologies to "radial"-type topologies. Further, in the present description and in the following claims, "radial" will be used to designate elements or fingers extending substantially perpendicularly to main vertical electrodes.

Figure 2:
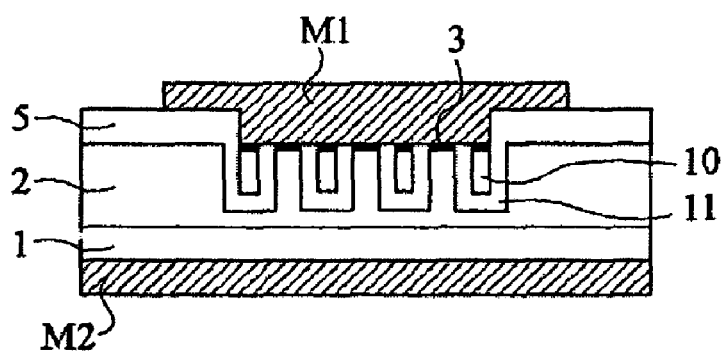

The TMBS-type Schottky diodes of FIGS. 6A, 6B, and 6C comprises an anode 31 and a cathode 32. This anode and this cathode are formed of a conductor, for example, a metal extending across the entire thickness of a lightly-doped N-type silicon wafer 33. A heavily-doped N-type region 35 is adjacent to cathode electrode 32. Conductive fingers 36, for example, heavily-doped polysilicon, extend radially from anode conductor 31 and are surrounded with an insulating layer 37. A metal, a metal silicide, or the like forming a junction or Schottky barrier with the lightly-doped N-type silicon, for example, a nickel silicide 39, is arranged at the interface between anode electrode 31 and substrate 33. A TMBS-type Schottky diode structure turned over with respect to usual structures is thus effectively obtained, that is, the top view substantially corresponds to the cross-section view of a usual TMBS diode such as illustrated in FIG. 2.

The cross-section views of FIGS. 6B and 6C illustrate, in addition to the previously-described elements, an upper metallization M1 in contact with anode fingers 31 and a lower metallization M2 in contact with cathode fingers 32. A non-referenced insulating layer is inserted at locations where a contact must be avoided.

FIGS. 7A to 7K are cross-section views along line A-A of FIG. 6A illustrating successive steps of a possible manufacturing mode of a device according to the present invention.

In these drawings, the central black line indicates a plane change in cross-section A-A. Further, only certain main steps are described, and not those details obvious for those skilled in the art, such as certain masking, planarization, anneal steps . . . etc.

Figure 7A:
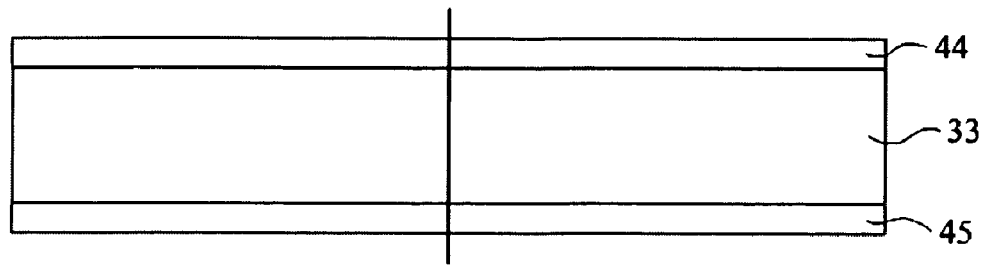
FIGS. 7A to 7I illustrate successive steps of the manufacturing of a TMBS-type diode according to the present invention.

It is started from a silicon wafer 33 coated on its external surface areas with upper and lower oxide layers 44 and 45 (FIG. 7A).

Figure 7B:
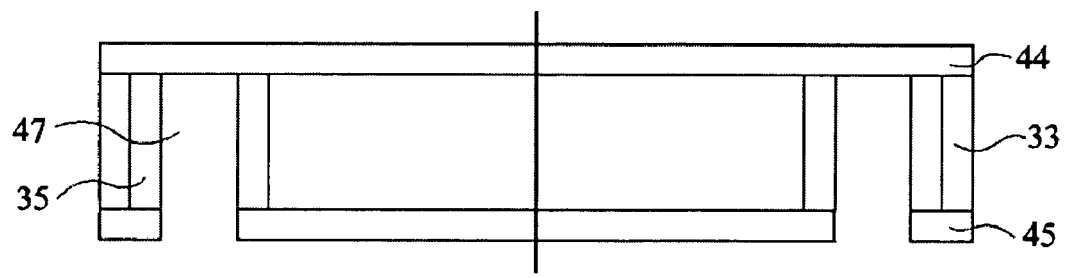

Finally, the wafer is completely opened from its lower surface by photographic etch or by any other means selected to form openings 47 at locations where the cathodes must be formed. A diffusion is then performed to obtain heavily-doped N-type cathode layers 35 (FIG. 7B).

Figure 7C:
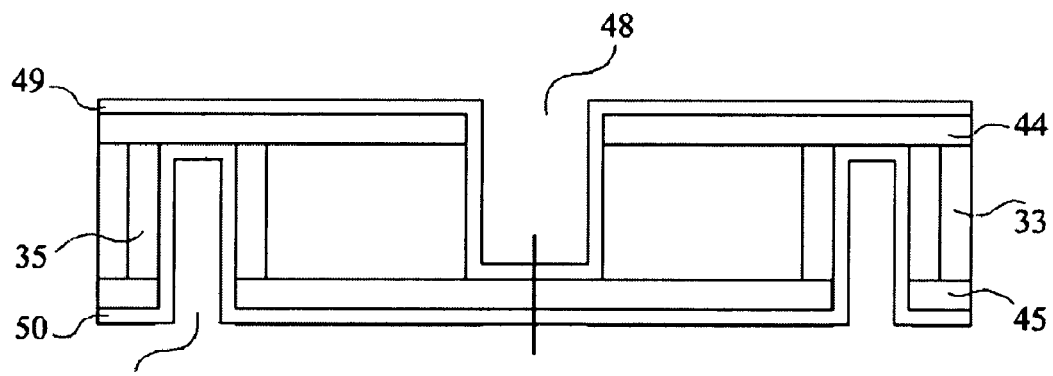

Then, the wafer is completely opened from its upper surface by photographic etch or by any other means selected to form openings 48 at locations where the anodes must be formed. A protection layer is deposited, for example, a silicon nitride, designated with reference 49 on the upper surface side and with reference 50 on the lower surface side (FIG. 7C).

Figure 7D:
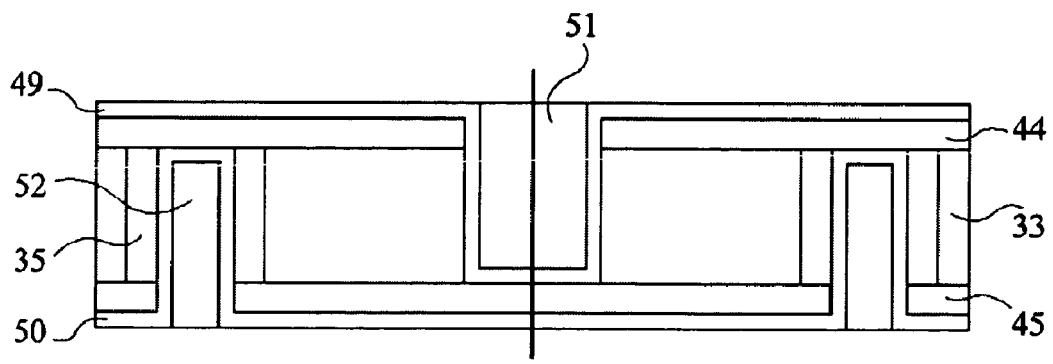

Then, a filling and a planarization of the openings formed in the wafer, for example, by silicon oxide designated with references 51 on the anode and 52 on the cathode side, is performed (FIG. 7D).

Figure 7E:
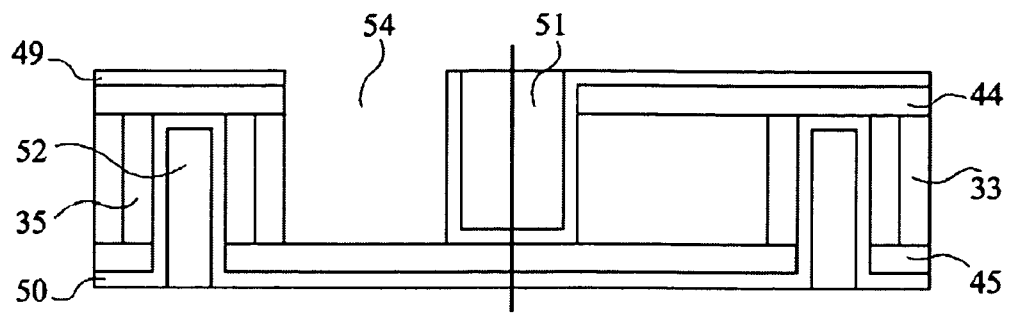

Then, an etching is performed from the upper surface at the locations where the transverse insulated fingers designated with reference 36 in FIG. 6 are desired to be formed. This opening is designated with reference 54 (FIG. 7E).

Figure 7F:
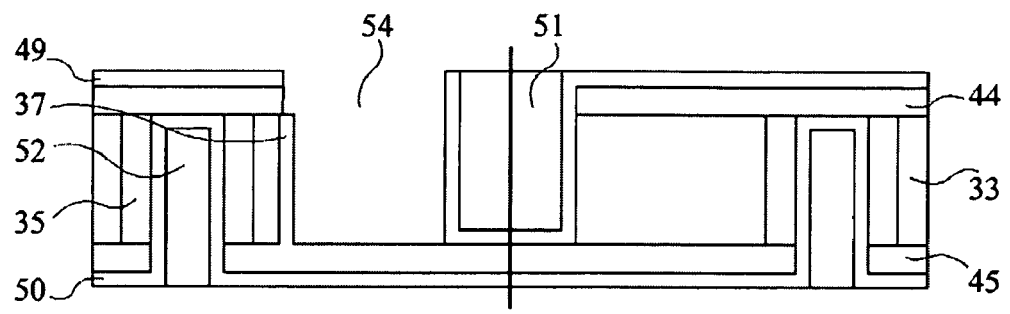

Then, an oxidation is performed to form oxide layer 37 of insulation of polysilicon fingers 36 (FIG. 7F).

Figure 7G:
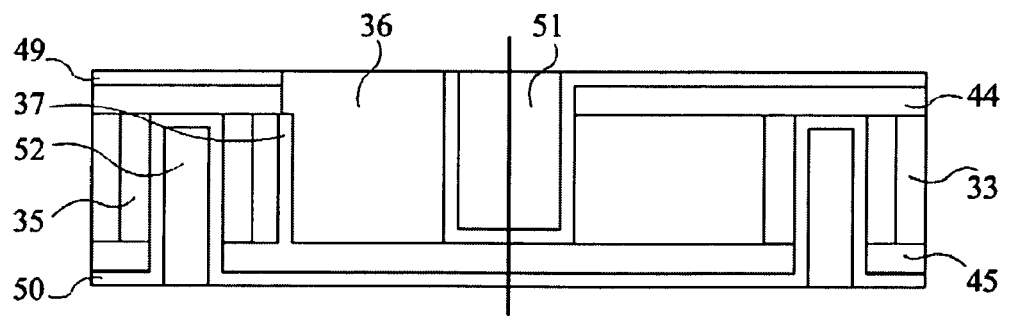

Then, openings 54 are filled with polysilicon 36 and planarized (FIG. 7G).

Figure 7H:
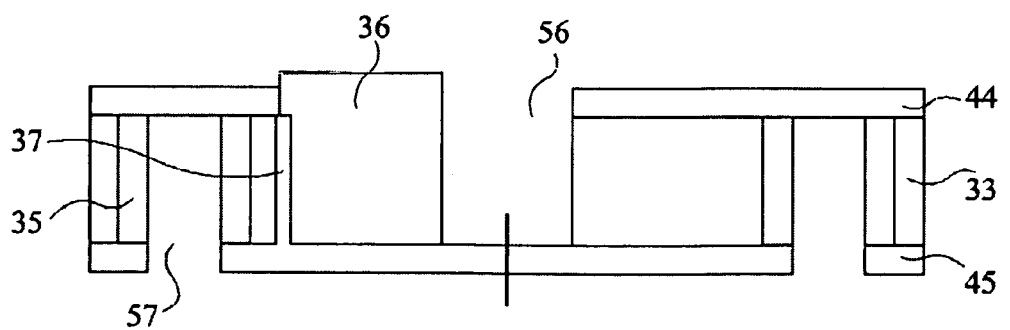
Figure 7I:
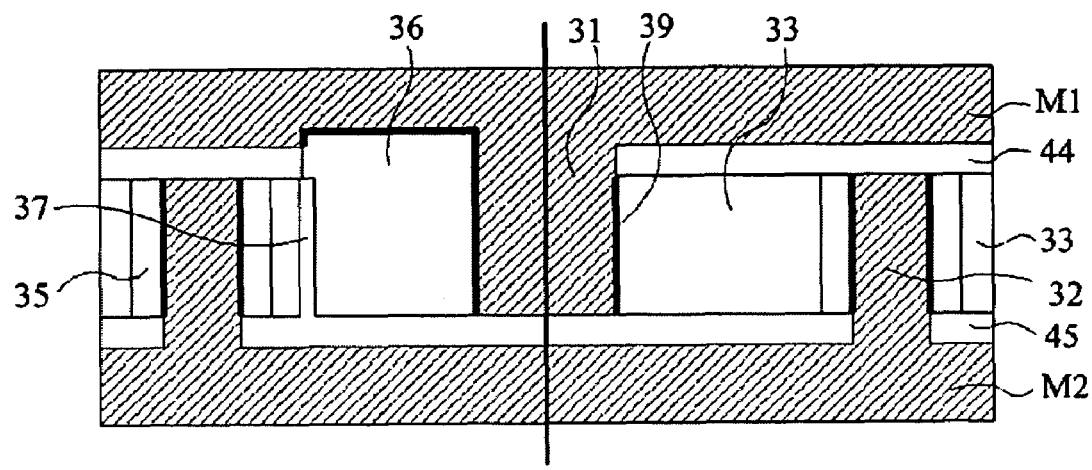

Then, steps of wet deoxidation, then of wet etch, of the silicon nitride, are successively performed to disengage anode openings designated with reference 56 and cathode openings designated with reference 57 (FIG. 7H).

Then, a metal is deposited, an anneal is performed to obtain a silicide intended to form Schottky barrier 39, and the excess metal is eliminated. It should be noted that this silicide may be formed without any inconvenience at the cathode level, where it will have no Schottky effect, but merely a contact function. A filling with a metal conductor is performed to form the vertical anodes and cathodes. And, if this does not result from the previous step, upper and lower metallizations M1 and M2 are deposited and etched. The structure of FIG. 7I, which corresponds to the structure already illustrated and described in relation with FIG. 6B, is thus obtained.

As compared to a prior-art TMBS Schottky diode with a horizontal junction, a TMBS Schottky diode with a vertical junction/barrier according to the present invention has the previously-indicated advantage according to which the junction surface area increases for a given chip surface area.

Further and, as should be understood by those skilled in the art in reference to the previous description of a possible method for manufacturing a structure according to the present invention, a TMBS Schottky diode with a vertical junction/barrier according to the present invention has the advantage that any selected shape, possibly complex, can be simply given to the fingers of creation of a field effect, since the shape of these fingers results from a masking and etch operation, and not from an implantation/diffusion operation.

Figure 8:
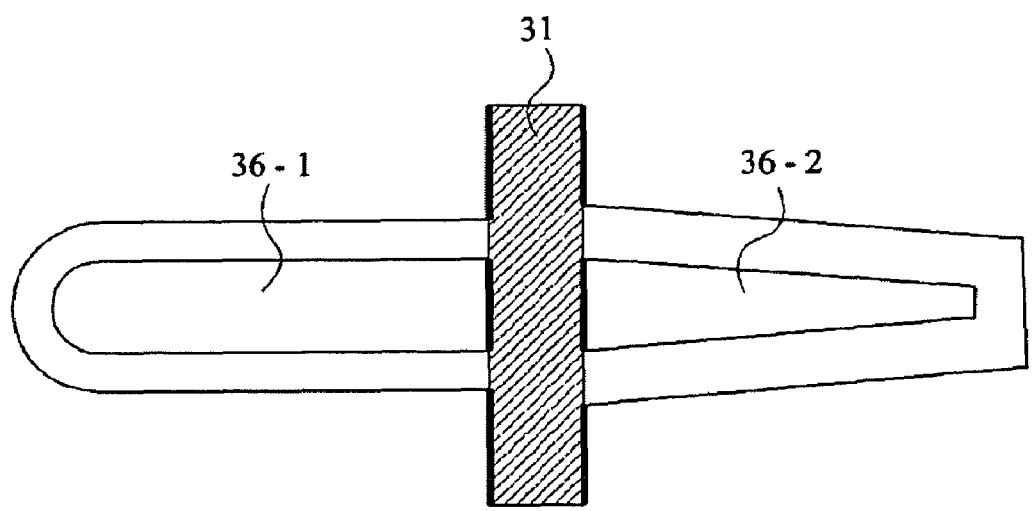
FIG. 8 is a top view illustrating alternative TMBS diodes according to the present invention.

Two possible shapes of fingers 36 have been shown in top view in FIG. 8, to the left and to the right of a vertical anode conductor 31. Left-hand finger 36-1 has a rounded shape at its end most remote from the anode. This shape improves the breakdown voltage. Indeed, breakdowns are known to be likely to occur essentially in areas of strong curvature of a structure. On the right-hand side of the drawing, a finger 36-2 has been shown to be wider at the anode level than at the level of its remote end. This favors a stronger depletion of the intermediary areas between fingers at the anode level than remotely from the anode. This also results in an improvement of the breakdown voltage of the device, and above all a reduction in the leakage current.

Another advantage of the structure according to the present invention is the fact that a placing in series or in parallel of the Schottky diodes of the elementary cells is particularly simple to implement.

Figure 9A:
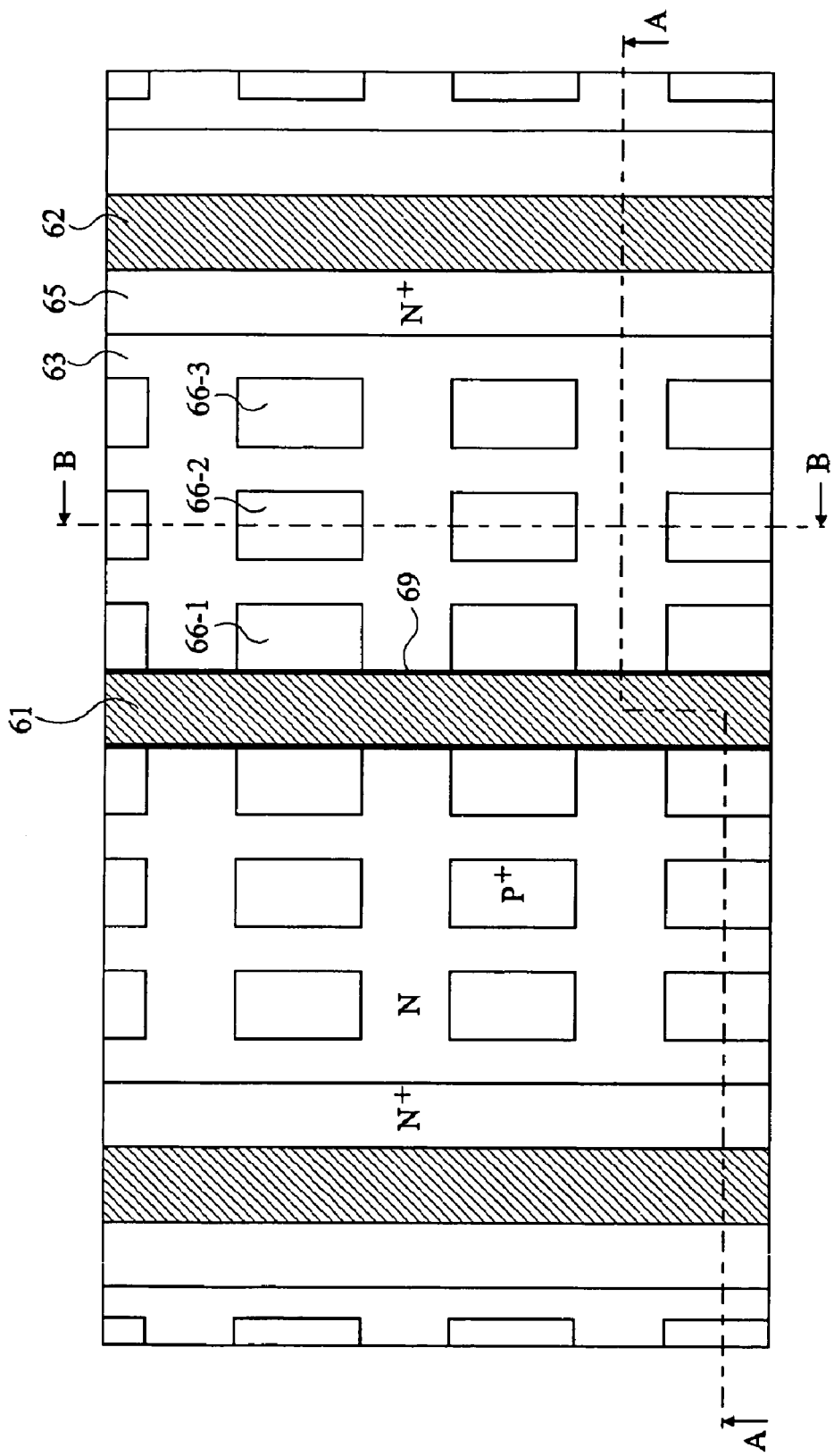
FIG. 9A is a top view illustrating a Schottky-bipolar diode with floating islets according to an embodiment of the present invention.
Figure 9B:
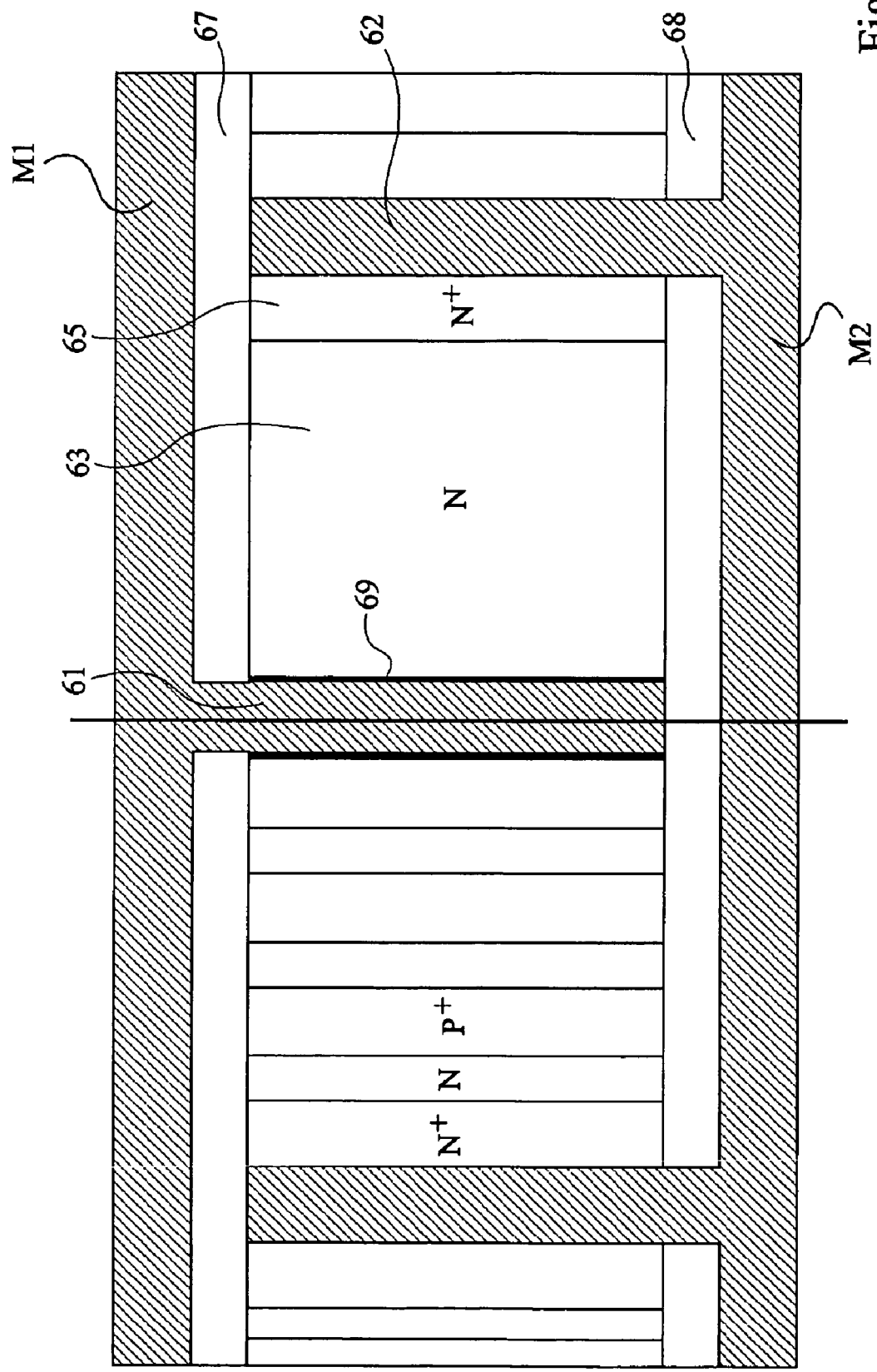
FIG. 9B is a cross-section view along line A-A of FIG. 9A.
Figure 9C:
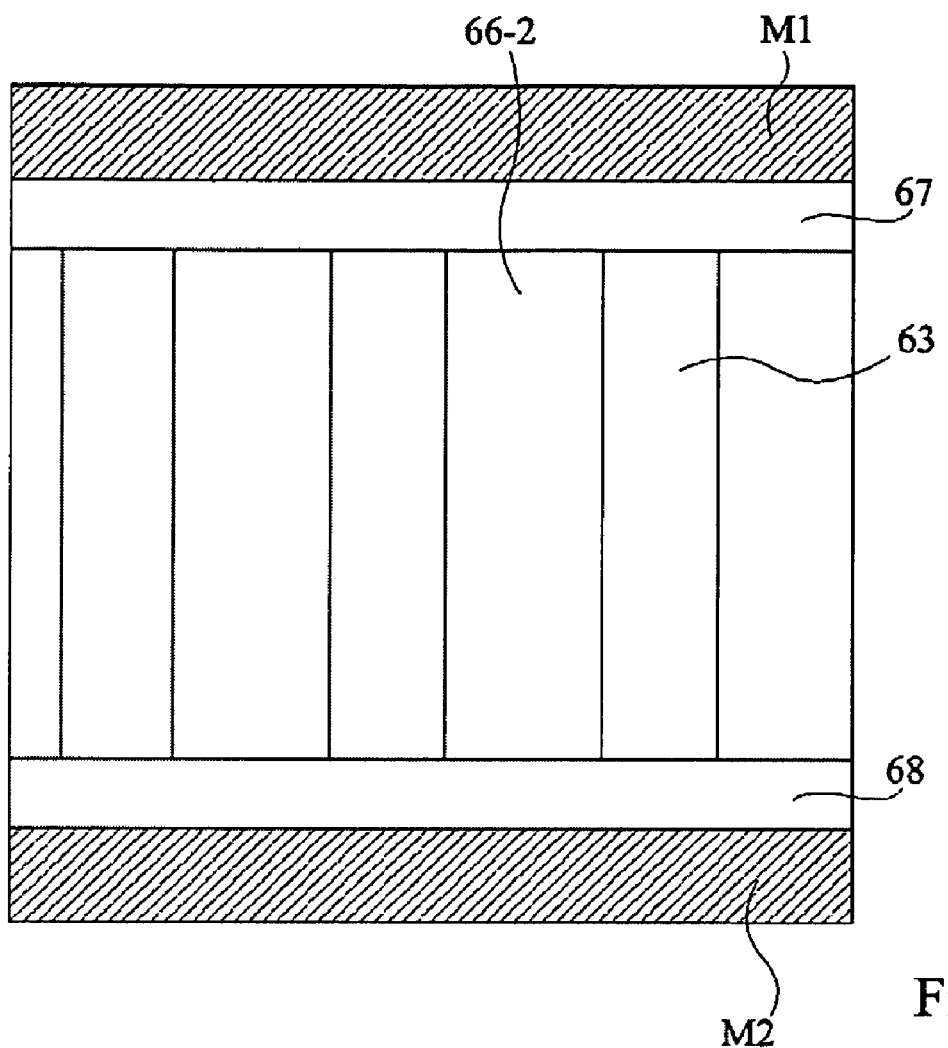
FIG. 9C is a cross-section view along line B-B of FIG. 9A.

FIGS. 9A, 9B, 9C show, respectively in top view and in cross-section views along line A-A and along line B-B, an embodiment of a Schottky diode of floating islet Schottky-bipolar type.

A lightly-doped N-type silicon substrate 63 can be found again between a vertical anode metallization 61 perpendicular to the wafer and a vertical cathode metallization 62 perpendicular to the wafer. A heavily-doped N-type layer 65, intended to obtain an ohmic contact, is in contact with cathode metallization 62. P-type doped polysilicon fingers extend radially from anode electrode 61. These fingers may be continuous. A structure with floating islets comprising fingers 66, each formed of three discontinuous portions 66-1, 66-2, and 66-3 have been shown in the drawing. References 67 and 68 designate an insulator, for example, an oxide. A metal, suicide or another element intended to ensure a Schottky contact 69 is interposed between anode conductor 61 and lightly-doped N-type silicon substrate 63.

Figure 3A:
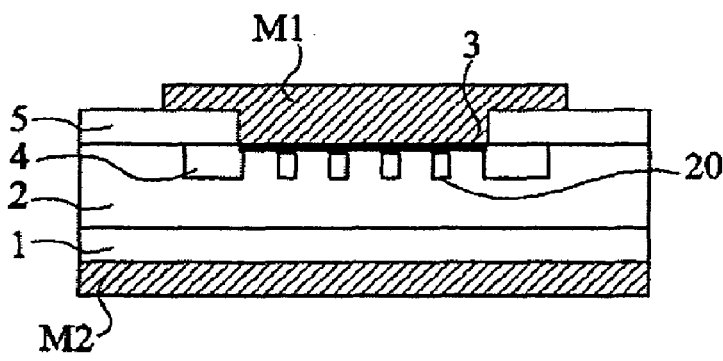
Figure 3B:
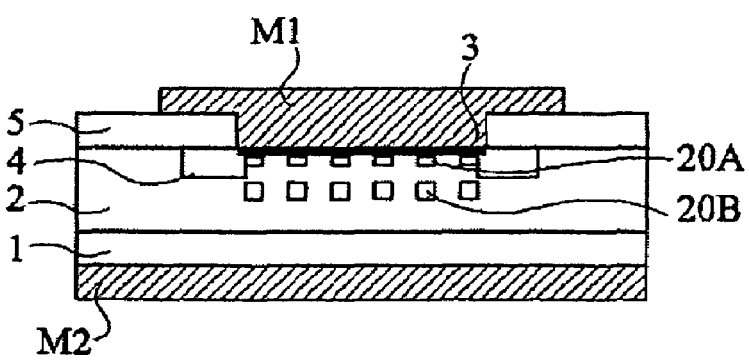

A structure which, in top view, substantially corresponds to the cross-section view of the device of prior art shown in FIG. 3B is thus effectively obtained. FIGS. 9A-9C will not be described in further detail, given that they can be well understood referring to the explanations previously given in relation with the TMBS Schottky diode with a vertical junction.

Those skilled in the art can form a structure such as that of FIGS. 9A-9C by a method similar to that described previously. The essential difference between this method and that previously described is the fact that the filling of the trenches described in relation with FIGS. 7E to 7G is not preceded with an oxidation step, but with a dopant diffusion step. Thus, the islets will be formed of a doped single-crystal silicon region at the periphery of a polysilicon core.

Figure 10:
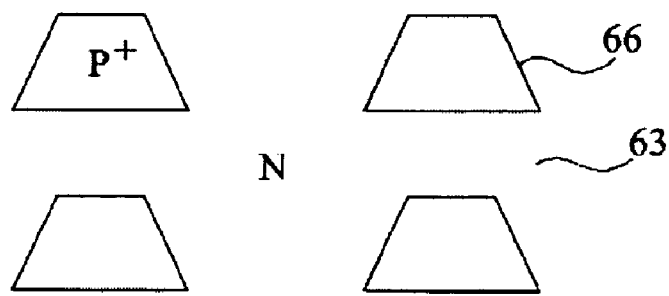
FIG. 10 is a top view illustrating an alternative embodiment of a bipolar Schottky diode according to the present invention.

Such a Schottky-bipolar diode with a vertical barrier has, over a conventional Schottky-bipolar diode, advantages similar to those previously indicated for a TMBS Schottky diode. In the case of a Schottky-bipolar diode with floating islets, it should be underlined that conventional manufacturing methods are generally complex. Again, carefully-selected shapes may be given to the radial fingers, or to the radial islets, for example, such as that illustrated in top view in FIG. 10.

It should be noted that the performances of a Schottky-bipolar diode with floating islets especially depend on the number of floating islets. For conventional structures, the manufacturing method is complex for each floating islet level (epitaxy, masking, implantation) and must be repeated several times. According to the present invention, whatever the number of floating islet levels, they are formed by the same steps.

Similarly, according to prior art, the shape of the fingers of a TMBS diode or of the floating islets of a Schottky-bipolar diode depends on sequences of epitaxy, masking, and implantation operations, while according to the present invention, it only depends on a mask pattern, which simplifies the operations and leaves a great shape selection freedom to the designer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A Schottky diode with a vertical barrier extending perpendicularly to the surface of a semiconductor chip comprising:
    a substrate body material extending through an entire thickness of the semiconductor chip; and
    a vertical central metal conductor extending through an entire thickness of the semiconductor chip, the vertical central metal conductor being in contact, substantially along its entire length, on the one hand with the substrate body material of the semiconductor chip with an interposed interface forming a Schottky barrier, and on the other hand with radially-extending conductive fingers.

2. The Schottky diode of claim 1, of TMBS type, wherein the radially-extending conductive fingers are insulated at their periphery.

3. The Schottky diode of claim 1, of Schottky-bipolar type, wherein the radially-extending fingers correspond to heavily-doped P-type semiconductor regions.

4. The Schottky diode of claim 3, wherein said fingers are separated in discontinuous fragments.

5. The Schottky diode of claim 1, wherein the shape in top view of said fingers is determined by a shape of a mask used in a process of forming the fingers.

6. The Schottky diode of claim 5, wherein the end of said fingers is rounded.

7. The Schottky diode of claim 5, wherein the end of said fingers is narrower than the portion of said fingers in contact with the central conductor.

* * * * *

UNITED STATES PATENT AND TRADEMARK OFFICE
CERTIFICATE OF CORRECTION

PATENT NO.        : 7,622,752 B2
APPLICATION NO.   : 11/317270
DATED             : November 24, 2009
INVENTOR(S)       : Frédéric Lanois et al.

It is certified that error appears in the above-identified patent and that said Letters Patent is hereby corrected as shown below:

Col. 5, line 25, should read:
designate an insulator, for example, an oxide. A metal, silicide Signed and Sealed this Fifth Day of January, 2010

David J. Kappos
*Director of the United States Patent and Trademark Office*